United States Patent
Hiyama

(10) Patent No.: US 6,680,630 B1
(45) Date of Patent: Jan. 20, 2004

(54) DRIVER CIRCUIT FOR POWER DEVICE

(75) Inventor: Kazuaki Hiyama, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/357,216

(22) Filed: Feb. 4, 2003

(30) Foreign Application Priority Data

Aug. 8, 2002 (JP) ........................................ 2002-231307

(51) Int. Cl.[7] .............................................. H02H 7/122
(52) U.S. Cl. ............................................ 327/110; 363/34
(58) Field of Search ........................ 363/34, 39, 56.05; 327/108, 110

(56) References Cited

U.S. PATENT DOCUMENTS 6,351,399 B2 * 2/2002 Takanashi et al. ....... 363/56.05

FOREIGN PATENT DOCUMENTS

| JP | 10-42575 | 2/1998 |
| JP | 11-27931 | 1/1999 |
| WO | WO 01/59918 | 8/2001 |

OTHER PUBLICATIONS

U.S. patent application Ser. No. 10/331,647 Hiyama filed Dec. 31, 2002.
U.S. patent application Ser. No. 10/357,216 Hiyama filed Feb. 4, 2003.

* cited by examiner

*Primary Examiner*—Dinh T. Le
(74) *Attorney, Agent, or Firm*—Oblon, Spivak, McClelland, Maier & Neustadt, P.C.

(57) ABSTRACT

A low side switching driver circuit (50) includes an emitter follower circuit, an input buffer (51), and a power source (52) and capacitors (53, 54) for driving these circuits. The power source (52) is not provided for each one of low side switching elements (5, 6, 7), but the low side switching elements (5, 6, 7) use the power source (52) as a common power source thereamong. A resistor (58) is provided between the node between the negative pole of the capacitor (53) and a first low potential power source line, and a second low potential power source line (G) of the low side switching driver circuit. The capacitor (54) is connected to the input buffer (51). Resistors (59, 60) as current limiting elements are provided between the input buffer (51) and the power source (52).

8 Claims, 8 Drawing Sheets

DRIVER CIRCUIT FOR POWER DEVICE

TITLE OF THE INVENTION

BACKGROUND OF THE INVENTION

1. Field of the Invention

The present invention relates to a driver circuit for power device. More particularly, it relates to a driver circuit for power device preventing malfunction or breakdown while allowing scaledown and cost reduction thereof.

2. Description of the Background Art

FIG. 8 is a circuit diagram illustrating a three-phase inverter circuit and a driver circuit thereof in the background art. A three-phase inverter circuit 100 in FIG. 8 includes high side switching elements 101, 103 and 105, and low side switching elements 102, 104 and 106. The three-phase inverter circuit 100 further includes diodes 107, 109 and 111 respectively connected in parallel to the high side switching elements 101, 103 and 105, and diodes 108, 110 and 112 respectively connected in parallel to the low side switching elements 102, 104 and 106.

The high side switching elements 101, 103 and 105, and the low side switching elements 102, 104 and 106 each receive power supplied thereto from a power source 113. Interconnect lines for connecting the high side switching elements 101, 103, 105 and the low side switching elements 102, 104, 106 have respective self-inductances as indicated by reference numerals 114 through 121 in FIG. 8. The high side switching elements 101, 103 and 105, and the low side switching elements 102, 104 and 106 are each an IGBT (insulated gate bipolar transistor).

A Load such as a three-phase motor 122 is connected to the three-phase inverter circuit 100. A high side switching driver circuit is connected to each one of the high side switching elements 101, 103 and 105, and a low side switching driver circuit is connected to each one of the low side switching elements 102, 104 and 106. In FIG. 8, only a high side switching driver circuit 200 connected to the high side switching element 101, and a low side switching driver circuit 300 connected to the low side switching element 102 are shown. Those driver circuits respectively connected to the high side switching elements 103 and 105, and to the low side switching elements 104 and 106 are omitted. The inverter circuit, the high side switching driver circuit, and low side switching driver circuit constitute a driver circuit for power device.

The high side switching driver circuit 200 connected to the high side switching element 101 includes an emitter follower circuit, a high voltage IC 201, and a power source 202 and capacitors 203 and 204 for driving these circuits. An NPN transistor (on-side emitter follower transistor) 205 and a PNP transistor (off-side emitter follower transistor) 206 constitute the emitter follower circuit of the high side switching driver circuit 200. Emitter terminals of the transistors 205 and 206 are respectively connected to resistors 207 and 208, and then commonly connected to the gate terminal of the high side switching element 101. The capacitor 203 is provided between a high-voltage side power source terminal Vb and a high-voltage side reference terminal Vs in the high voltage IC 201, and the capacitor 204 is provided between a low-voltage side power source terminal Vcc and a low-voltage side reference terminal Vss in the high voltage IC 201. An input terminal IN of the high voltage IC 201 receives a driving signal Hi-IN of the high side switching element inputted thereto. The driving signal Hi-IN is outputted from an output terminal OUT of the high voltage IC 201 to the emitter follower circuit.

Similarly, the low side switching driver circuit 300 connected to the low side switching element 102 includes an emitter follower circuit, a high voltage IC 301, and a power source 302 and capacitors 303, 304 for driving these circuits. An NPN transistor 305 and a PNP transistor 306 constitute the emitter follower circuit of the low side switching driver circuit 300. Emitter terminals of the transistors 305 and 306 are respectively connected to resistors 307 and 308, and then commonly connected to the gate terminal of the low side switching element 102. The capacitor 303 is provided between a high-voltage side power source terminal Vb and a high-voltage side reference terminal Vs in the high voltage IC 301, and the capacitor 304 is provided between a low-voltage side power source terminal Vcc and a low-voltage side reference terminal Vss in the high voltage IC 301. The capacitors 204 and 304 are connected to a power source 309. AN input terminal IN of the high voltage IC 301 receives a driving signal Low-IN of the low side switching element inputted thereto. The driving signal Low-IN is outputted from an output terminal OUT of the high voltage IC 301 to the emitter follower circuit.

As shown in FIG. 8, clamping diodes 209 and 310 are further provided to the high voltage ICs 201 and 301, respectively. The clamping diodes 209 and 310 each have an anode connected to the low-voltage side reference terminal Vss, and a cathode connected to the high-voltage side reference terminal Vs. As disclosed in Japanese Patent Application Laid-Open No. 10-42575 (1998), the clamping diodes 209 and 310 are operative to protect the high voltage ICs 201 and 301 from negative potential surge (hereinafter referred to as negative surge). Such negative surge is generated by the variation in current with respect to time (di/dt) and the self-inductances 114 through 121 of the interconnect lines when the high side switching elements 101, 103 and 105, or the low side switching elements 102, 104 and 106 are switched for driving the load.

However, the clamping diodes 209 and 310 may not be operative enough to sufficiently protect the high voltage IC 201 of the high side switching driver circuit and the high voltage IC 301 of the low side switching driver circuit, respectively. As a countermeasure therefor, in the three-phase inverter circuit and the driver circuit thereof shown in FIG. 8, a resistor 400 is interposed between the emitter terminal of the low side switching element 104 and the power source 309. When the negative surge is generated, negative surge current flowing in the clamping diodes 209 and 310 is limited so that the high voltage ICs 201 and 301 can be protected. Such technique is disclosed in PCT Publication No. WO 01/59918.

When only the high side switching element 101 and the low side switching element 104 are in ON state and the high side switching element 101 is switched to OFF state, the negative surge is generated in the three-phase inverter circuit and the driver circuit thereof in FIG. 8, the detail of which will be given below.

When only the high side switching element 101 and the low side switching element 104 are in ON state, current supplied from the positive pole of the power source 113 flows through the high side switching element 101, self-inductance 114, load 122, self-inductance 117, low side switching element 104, and the self-inductance 121 in this order. The current then returns to the negative pole of the power source 113.

Next, when the high side switching element 101 is switched to OFF state, the current flowing through the load 122 follows the different path. Namely, the current flows through the load 122, self-inductance 117, low side switching element 104, self inductance 120, diode 108, self-inductance 115, and the load 122 in this order. In the course of this current flow, the self inductances 114, 115, 120 and 121 of the interconnect lines generate the negative surge.

When such negative surge is generated, the low-voltage side reference terminal Vss and the high-voltage side reference terminal Vs in the high voltage IC 201 of the high side switching driver circuit 200 receive voltage applied thereto. This voltage is the sum of induced voltages of the self-inductances 114, 115 and 120, and forward voltage of the diode 108. The clamping diode 209 is then switched to ON state, whereby forward voltage of the clamping diode 209 is applied between the low-voltage side reference terminal Vss and the high-voltage side reference terminal Vs in the high voltage IC 201 that are connected in parallel to the clamping diode 209.

As seen from FIG. 8, further, the resistor 400 is provided in the path between the low-voltage side reference terminal Vss and the high-voltage side reference terminal Vs in the high voltage IC 201. The current flowing through the clamping diode 209 is thereby limited. Therefore, the negative surge current can be limited by the resistor 400, whereby the forward voltage of the clamping diode 209 can be limited to a level that causes no malfunction or breakdown of the high voltage IC 201. As the resistor 400 is increased in resistance value, voltage drop in the resistor 400 becomes greater. The forward voltage of the clamping diode 209 can be limited accordingly.

According to the three-phase inverter circuit and the driver circuit thereof shown in FIG. 8, the high voltage IC 201 of the high side switching driver circuit and the high voltage IC 301 of the low side switching driver circuit can be protected from the negative surge generated by the self-inductances 114 through 121 of the interconnect lines. However, in the low side switching driver circuit for the low side switching elements 102, 104 and 106 shown in FIG. 8, the power sources 302 and 309 should be provided to each one of the elements 102, 104 and 106, resulting in increase in cost for the power source. For scaledown and cost reduction of the low side switching driver circuit for each of the low side switching elements 102, 104 and 106, the power sources 302 and 309 should be combined and the high voltage IC 301 should be eliminated.

SUMMARY OF THE INVENTION

It is therefore an object of the present invention to provide a driver circuit for power device including a high side switching driver circuit and a low side switching driver circuit. More particularly, it is the object of the present invention to protect a high voltage IC of the high side switching driver circuit from negative surge generated by a self inductance of an interconnect line while requiring no high voltage IC in the low side switching driver circuit, to realize scaledown and cost reduction of the driver circuit.

According to the present invention, the driver circuit for power device includes a plurality of low side switching elements for constituting an inverter circuit, a plurality of high side switching elements for constituting the inverter circuit, a plurality of high side switching driver circuits, and a plurality of low side switching driver circuits. The plurality of low side switching elements each have one terminal connected to a load, and other terminal connected to a low potential line of the inverter circuit. The plurality of high side switching elements each have one terminal connected to the load, and other terminal connected to a high potential line of the inverter circuit. The plurality of high side switching driver circuits respectively drive the plurality of high side switching elements. The plurality of high side switching driver circuits each include a high voltage IC. The plurality of low side switching driver circuits respectively drive the plurality of low side switching elements. The plurality of low side switching driver circuits each include a first low potential power source line, a second low potential power source line, a first high potential power source line, and a second high potential power source line each connected to the high voltage IC. The plurality of low side switching driver circuits each include a first power source, a first capacitor, a second capacitor, a first current limiting element, and second current limiting elements. The plurality of low side switching driver circuits are commonly connected to the first power source. The first capacitor is connected to the first power source through the first low potential power source line and the first high potential power source line. The second capacitor is connected to the first power source through the second low potential power source line and the second high potential power source line. The first current limiting element is provided between a node between the first low potential power source line and the first capacitor, and the second low potential power source line. The second current limiting elements are respectively provided on the second low potential power source line and the second high potential power source line for connecting the first power source and the second capacitor.

The driver circuit for power device includes the first current limiting element provided between the first power source to which the plurality of low side switching driver circuits are connected, and the low side switching element. Further provided are the second current limiting elements on the interconnect lines for connecting each of the plurality of low side switching driver circuits and the high voltage IC. Therefore, the high voltage IC of the high side switching driver circuit can be protected from negative surge. Further, as the driver circuit for power device requires no high voltage IC in the low side switching driver circuit, scale-down and cost reduction are realized.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
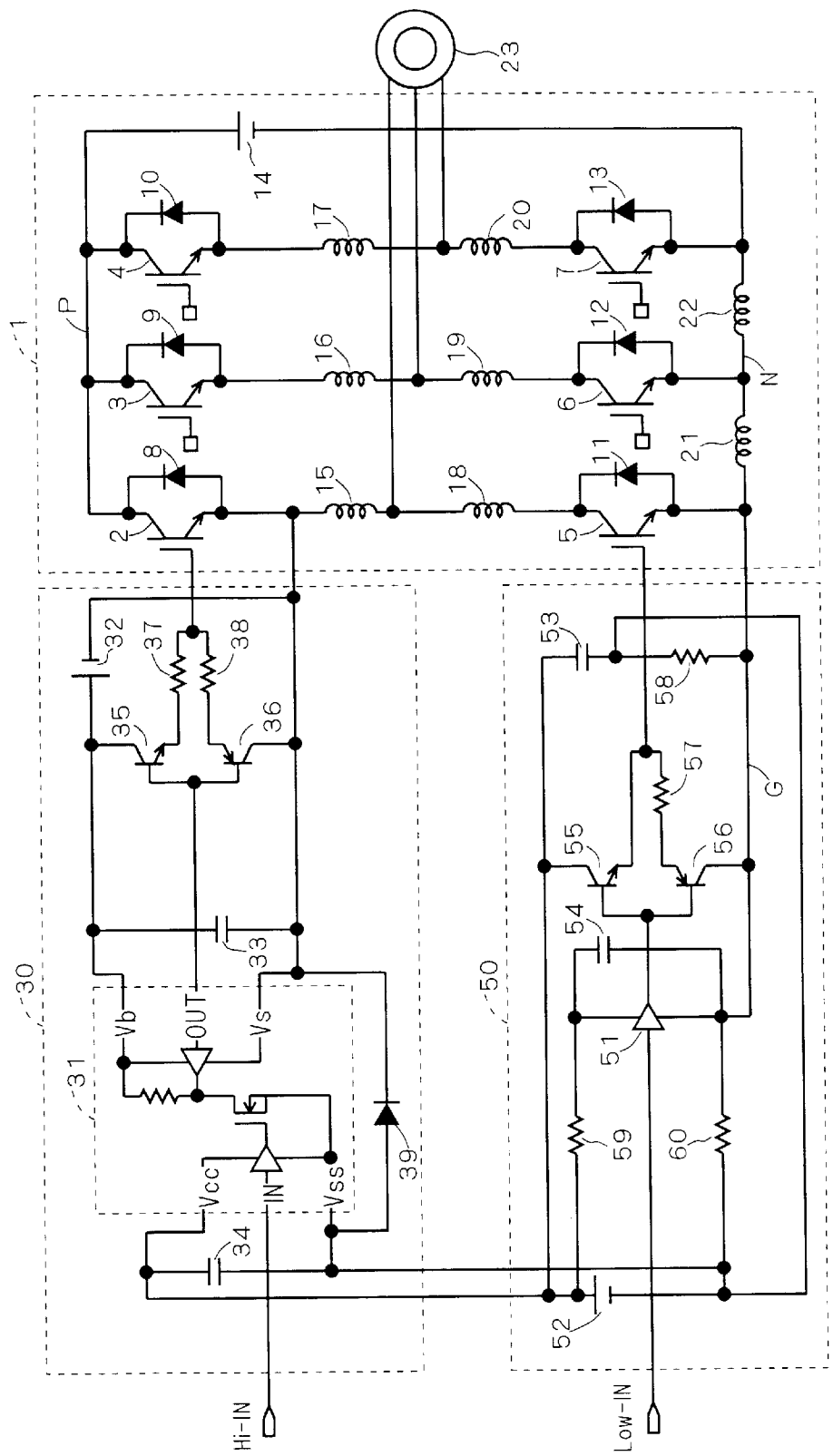
FIG. 1 is a circuit diagram illustrating a three-phase inverter circuit and a driver circuit thereof according to a first preferred embodiment of the present invention.

FIG. 1 is a circuit diagram illustrating the three-phase inverter circuit and the driver circuit thereof according to the first preferred embodiment of the present invention. A three-phase inverter circuit shown in FIG. 1 includes high side switching elements 2, 3 and 4, and low side switching elements 5, 6 and 7. The three-phase inverter circuit 1 further includes diodes 8, 9 and 10 respectively connected in parallel to the high side switching elements 2, 3 and 4, and diodes 11, 12 and 13 respectively connected in parallel to the low side switching elements 5, 6 and 7. In the first preferred embodiment, the inverter circuit is not necessarily a three-phase circuit. Alternatively, it may be a single-phase or other polyphase circuit.

The high side switching elements 2, 3 and 4, and the low side switching elements 5, 6 and 7 each receive power supplied thereto from a power source 14. Interconnect lines for connecting the high side switching elements 2, 3, 4 and the low side switching elements 5, 6, 7 have respective self-inductances as indicated by reference numerals 15 through 22 in FIG. 1. The high side switching elements 2, 3 and 4, and the low side switching elements 5, 6 and 7 are each shown to be an IGBT (insulated gate bipolar transistor). Alternatively, they may be each an MOSFET.

Each collector terminal of the high side switching elements 2, 3 and 4 is connected to a high potential line P, each emitter terminal thereof is connected to a load such as a three-phase motor 23, and each gate terminal thereof is connected to a high side switching driver circuit. Further, each emitter terminal of the low side switching elements 5, 6 and 7 is connected to a low potential line N, each collector terminal thereof is connected to a load such as the three-phase motor 23, and each gate terminal thereof is connected to a low side switching driver circuit.

In FIG. 1, only a high side switching driver circuit 30 connected to the high side switching element 2, and a low side switching driver circuit 50 connected to the low side switching element 5 are shown. Those driver circuit respectively connected to the high side switching elements 3 and 4, and to the low side switching elements 6 and 7 are omitted. The inverter circuit, the high side switching driver circuit, and the low side switching driver circuit constitute a driver circuit for power device.

The high side switching driver circuit 30 connected to the high side switching element 2 includes an emitter follower circuit, a high voltage IC 31, and a power source 32 and capacitors 33, 34 for driving these circuits. An NPN transistor (on-side emitter follower transistor) 35 and a PNP transistor (off-side emitter follower transistor) 36 constitute the emitter follower circuit of the high side switching driver circuit 30. Emitter terminals of the transistors 35 and 36 are respectively connected to resistors 37 and 38, and then commonly connected to the gate terminal of the high side switching element 2. The resistor 37 is an on-side gate resistor, and the resistor 38 is a off-side gate resistor.

The capacitor 33 is provided between a high-voltage side power source terminal Vb and a high-voltage side reference terminal Vs in the high voltage IC 31, and the capacitor 34 is provided between a low-voltage side power source terminal Vcc and a low-voltage side reference terminal Vss in the high voltage IC 31. An input terminal IN of the high voltage IC 31 receives a driving signal Hi-IN of the high side switching element inputted thereto. The driving signal Hi-IN is outputted from an output terminal OUT of the high voltage IC 31 to the emitter follower circuit. The high voltage IC 31 is further provided with a clamping diode 39 having an anode connected in parallel to the low-voltage side reference terminal Vss, and a cathode connected in parallel to the high-voltage side reference terminal Vs.

An emitter follower circuit, an input buffer 51, and a power source 52 and capacitors 53, 54 for driving these circuits constitute the low side switching driver circuit 51 connected to the low side switching element 5. The power source 52 is not prepared for each one of the low side switching elements 5, 6 and 7, but it is a common power source thereamong. An NPN transistor 55 and a PNP transistor 56 constitute the emitter follower circuit of the low side switching driver circuit 50. The emitter terminal of the PNP transistor 56 is connected to a resistor 57.

Emitter terminals of the NPN transistor 55 and the PNP transistor 56 are commonly connected to the gate terminal of the low side switching element 5. The input buffer 51 receives a driving signal Low-IN of the low side switching element inputted thereto. The driving signal Low-IN is outputted to each base terminal of the NPN transistor 55 and the PNP transistor 56 for forming the emitter follower circuit.

The capacitor 53 has a positive pole connected to the positive pole of power source 52 through a first high potential power source line, and a negative pole connected to the negative pole of the power source 52 through a first low potential power source line. The collector terminal of the NPN transistor 55 is connected to the first high potential power source line. The capacitor 54 has a positive pole connected to the positive pole of the power source 52 through a second high potential power source line, and a negative pole connected to the negative pole of the power source 52 through a second low potential power source line G. The input buffer 51 is further connected to the second low potential power source line G and the second high potential power source line.

A resistor 58 as a current limiting element (first current limiting element) is provided between the node between the negative pole of the capacitor 53 and the first low potential power source line, and the second low potential power source line G of the low side switching driver circuit 50. The collector terminal of the NPN transistor 55 is connected to the positive pole of the capacitor 53, and the collector terminal of the PNP transistor 56 is connected to the second low potential power source line G of the low side switching driver circuit 50. In some cases, the negative pole of the capacitor 53 and the negative pole of the power source 52 are connected without passing through the resistor 58. Such connection is intended to avoid loss at the resistor 58 in the course of charging the capacitor 53 with electricity from the power source 52.

Figure 8:
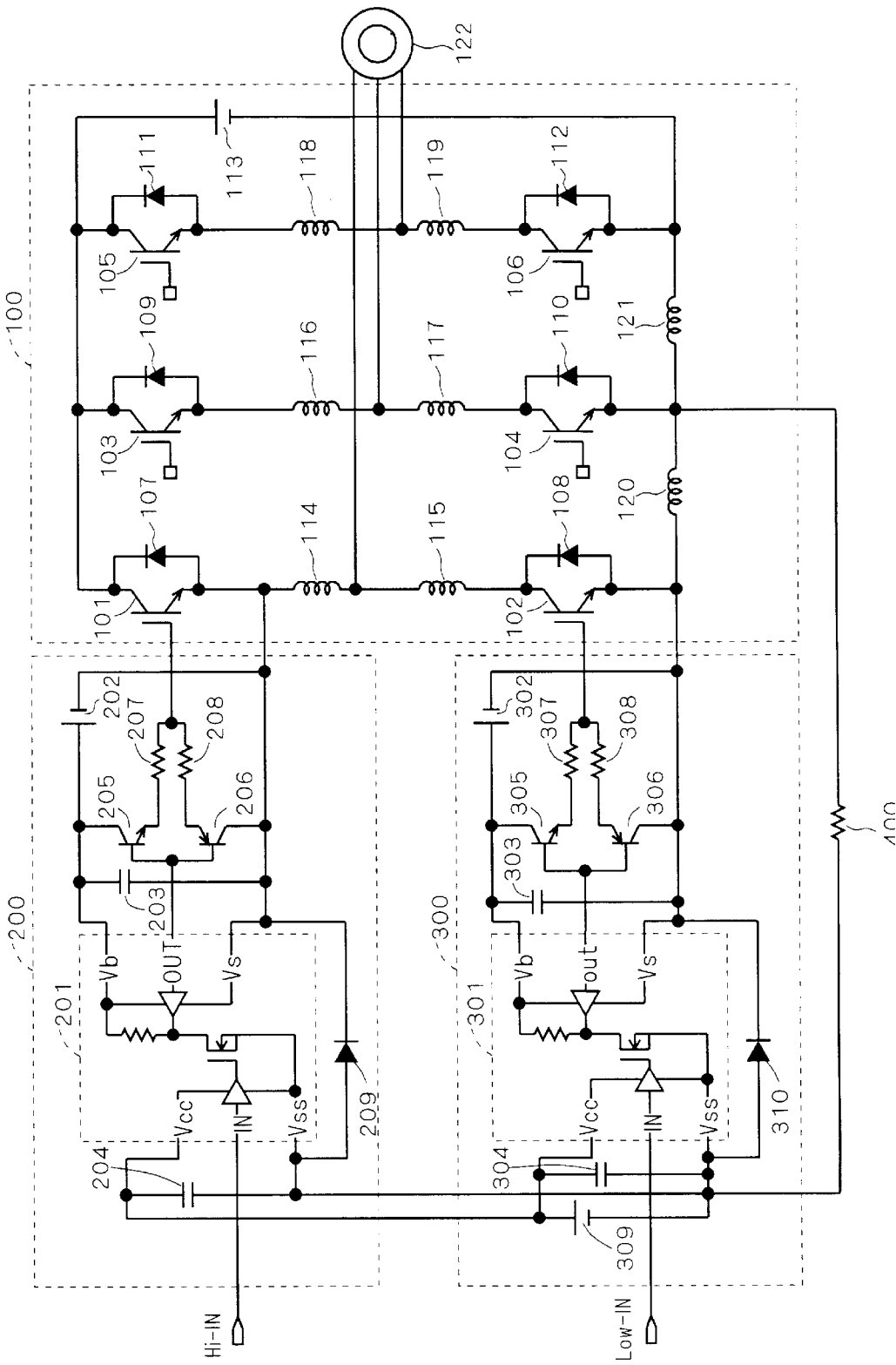
FIG. 8 is a circuit diagram illustrating the three-phase inverter circuit and the driver circuit thereof in the background art.

The low side switching driver circuit 50 of the first preferred embodiment has no resistor 307 as shown in FIG. 8. The resistor 307 acts as an on-side gate resistor of the low side switching element. In the first preferred embodiment, the resistor 58 is substituted for the resistor 307 shown in FIG. 8 as an on-side gate resistor of the low side switching element 5.

The capacitor 54 is connected to the input buffer 51. Resistors 59 and 60 as current limiting elements (second current limiting elements) are respectively provided on the second high potential power source line and the second low potential power source line G each defined between the input buffer 51 and the power source 52. The resistors 59 and 60 are set to be sufficiently larger in resistance value than the resistor 58. The input terminal of the input buffer 51 receives the driving signal Low-IN of the low side switching element inputted thereto.

The low side switching driver circuits according to the first preferred embodiment characteristically use a common power source and require no high voltage IC, the detail of which will be described. In FIG. 8, the power source 302 is provided to respond to the high voltage IC 301. In contrast, as the input buffer 51 is provided in FIG. 1 instead of the high voltage IC 301, there is no need for the power source 302. Further, the power source 52 is used as a common power source of the low side switching driver circuits of the respective low side switching elements, whereby only one power source is required.

However, using the power source 52 as a common power source of the low side switching driver circuits results in an electrical loop to be formed by the interconnect lines of the low side switching driver circuits and the interconnect lines of the low side switching elements 5, 6 and 7 connected to the second low potential power source line G. Such electrical loop leads to malfunction of one low side switching driver circuit to be caused by surge current generated at the self inductance provided on the interconnect line in other low side switching element, for example.

As the input buffer cannot be operative for controlling surge, a problem such as malfunction may occur by simply replacing the high voltage IC with the input buffer in the low side switching driver circuit. An optically isolated driving device such as a photocoupler, being operative for controlling surge, may be alternatively employed. However, the parts of such device are costly.

As a countermeasure therefor, in the low side switching driver circuit 50 of the first preferred embodiment, the resistors 59 and 60 are provided between the input buffer 51 and the power source 52, whereby surge current is unlikely to flow into the low side switching driver circuit 50. As a result, a possible problem occurring in the input buffer 51 such as malfunction can be prevented by the resistors 59 and 60. For the reasons given so far, in the low side switching driver circuit 50 of the first preferred embodiment, the high voltage IC 301 is replaced by the input buffer 51, and the power source 52 is used as a common power source and no power source 302 is required. That is, the low side switching driver circuits of the first preferred embodiment use a common power source thereamong and require no high voltage IC.

Further, in the driver circuit for power device according to the first preferred embodiment, the high voltage IC 31 of the high side switching driver circuit can be also protected from a negative surge to be generated by the self inductance of the interconnect line, the detail of which will be described. The negative surge generated at the three-phase inverter circuit 1 flows into the second low potential power source line G of the low side switching driver circuit 50, and thereafter, passes through the resistor 58 and the first low potential power source line, flowing into the clamping diode 39. As the resistors 59 and 60 are sufficiently larger in resistance value than the resistor 58, the negative surge never flows into the clamping diode 39 following the path including no resistor 58 therein.

The negative surge current to flow into the clamping diode 39 is limited at the resistor 58, so that the forward voltage of the clamping diode 39 is limited to a level causing no malfunction or breakdown of the high voltage IC 31. Namely, the resistor 58 is operative in the same manner as that of the resistor 400 in the background art shown in FIG. 8. Therefore, even in the driver circuit for power device according to the first preferred embodiment, the high voltage IC 31 of the high side switching driver circuit can be protected from the negative surge generated by the self inductances 15 through 22 of the interconnect lines.

As described, according to the driver circuit for power device of the first preferred embodiment, the high voltage IC 31 of the high side switching driver circuit can be protected from the negative surge generated by the self inductances 15 through 22 of the interconnect lines. Further, as the first preferred embodiment requires no high voltage IC in the low side switching driver circuit, scaledown and cost reduction of the driver circuit are realized.

Considering power loss and switching characteristic of the low side switching element, the first preferred embodiment does not include the resistor 307 as provided in FIG. 8, but includes the resistor 58 provided between the negative pole of the capacitor 53 and the second low potential power source line G of the low side switching driver circuit. However, the present invention is not limited to this configuration. The resistor 307 shown in FIG. 8 may be provided, and the resistor 58 may be at any position on the interconnect line directly connecting the negative pole of the capacitor 53 and the negative pole of the power source 52. Instead of the emitter follower circuit of the first preferred embodiment, further, a source follower circuit formed by an MOSFET, or a grounded emitter of a bipolar circuit may be applicable to the present invention.

Second Preferred Embodiment

Figure 2:
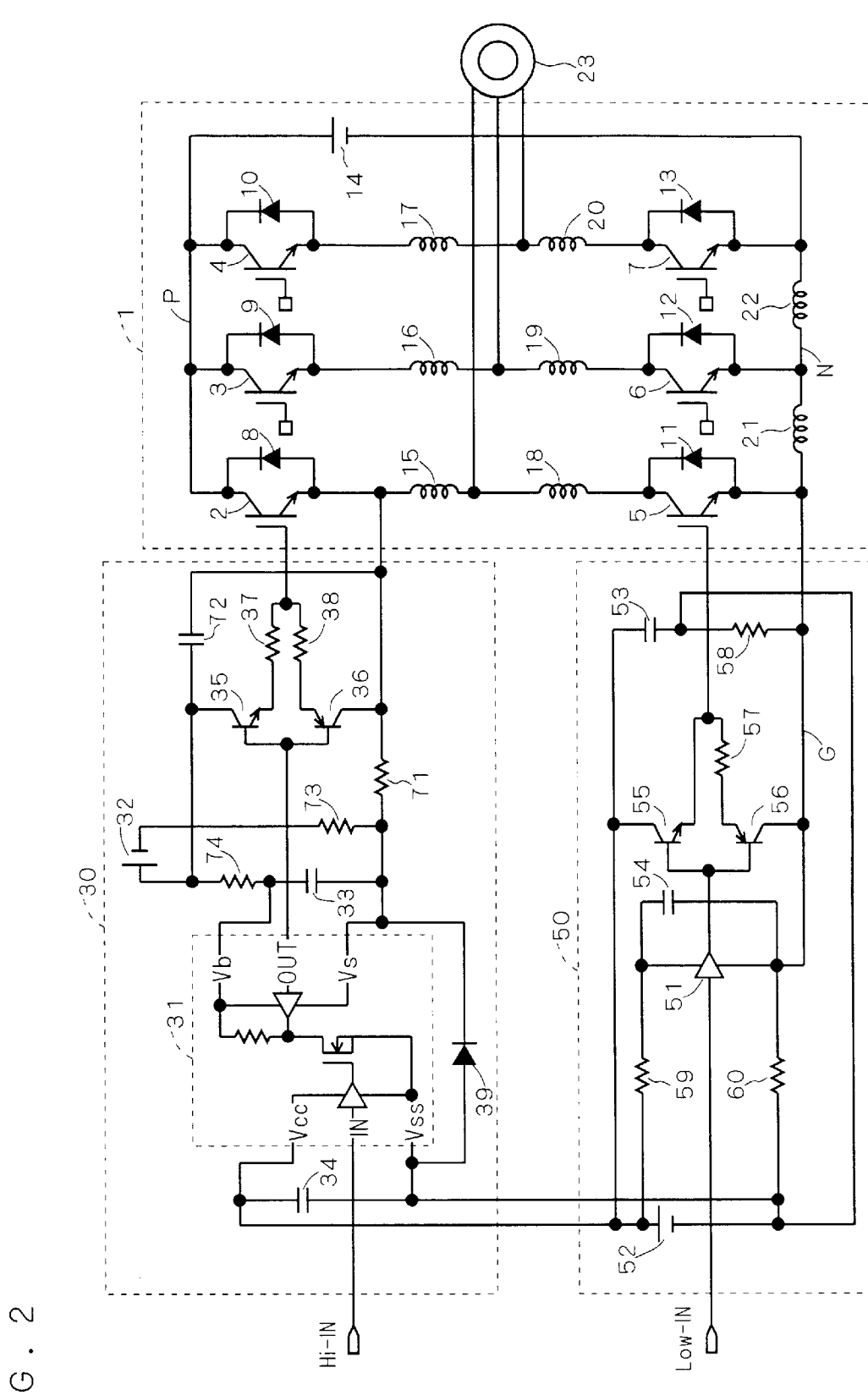
FIG. 2 is a circuit diagram illustrating a three-phase inverter circuit and a driver circuit thereof according to a second preferred embodiment of the present invention.

FIG. 2 is a circuit diagram illustrating the three-phase inverter circuit and the driver circuit thereof according to the second preferred embodiment of the present invention. The configuration of the three-phase inverter circuit and the driver circuit thereof according to the second preferred embodiment is substantially the same as that of the first preferred embodiment. In the following, only the distinct configuration from that of the first preferred embodiment will be discussed, and the common configuration will be omitted.

The high-voltage side reference terminal Vs in the high voltage IC 31 shown in FIG. 2 is connected to the collector terminal of the PNP transistor 36 and the emitter terminal of the high side switching element 2 through a resistor 71 as a current limiting element (third current limiting element). A capacitor 72 has a positive pole connected to the collector terminal of the PNP transistor 35, and a negative pole connected to the collector terminal of the PNP transistor 36. The capacitor 72 is located at the position corresponding to that of the power source 32 in FIG. 1. The power source 32 has a negative pole connected to the high-voltage side reference terminal Vs in the high voltage IC 31 through a resistor 73 as a current limiting element (third current limiting element), and a positive pole connected to the high-voltage side power source terminal Vb in the high voltage IC 31 through a resistor 74 as a current limiting element (third current limiting element).

In the first preferred embodiment, on the occurrence of the negative surge, only the resistor 58 becomes operative to limit the current flowing into the clamping diode 39. However, the resistor 58 also acts as an on-side gate resistor of the low side switching element 5. Due to this, the resistance value of the resistor 58 should be controlled to a level allowing the resistor 58 to act as the on-side gate resistor of the low side switching element 5. This is because as the on-side gate resistance increases, turn-off speed of the low side switching element 5 is lowered, thereby leading to increase in switching loss.

Hence, the resistance value of the resistor 58 is so controlled to cause no increase in switching loss. Conversely, if the resistance value of the resistor 58 is too small, current flowing into the clamping diode 39 cannot be sufficiently limited. In this case, malfinction or breakdown of the high voltage IC 31 may be caused.

In addition to the resistor 58, the resistors 71, 73 and 74 as current limiting elements are provided on the side of the cathode of the clamping diode 39 in the second preferred embodiment, to limit the negative surge current flowing into the clamping diode 39. According to the driver circuit for power device of the second preferred embodiment, the high voltage IC 31 of the high side switching driver circuit can be protected from the negative surge generated by the self inductance of the interconnect line. Further, as the second preferred embodiment requires no high voltage IC in the low side switching driver circuit, scaledown and cost reduction of the driver circuit are realized. Still further, the configuration including the resistors 71, 73 and 74 provides flexibility in resistance value of the resistor 58 in terms of control of the negative surge current. As a result, the resistance value of the resistor 58 can be optimized so as to reduce switching loss.

Considering power loss and switching characteristic of the low side switching element, the second preferred embodiment also includes no resistor 307 as provided in FIG. 8, but includes the resistor 58 between the negative pole of the capacitor 53 and the second low potential power source line G of the low side switching driver circuit. However, the present invention is not limited to this configuration. The resistor 307 shown in FIG. 8 may be provided, and the resistor 58 may be at any position on the interconnect line directly connecting the negative pole of the capacitor 53 and the negative pole of the power source 52. Instead of the emitter follower circuit of the second preferred embodiment, further, a source follower circuit formed by an MOSFET, or a grounded emitter of a bipolar circuit may be applicable to the present invention.

Figure 3:
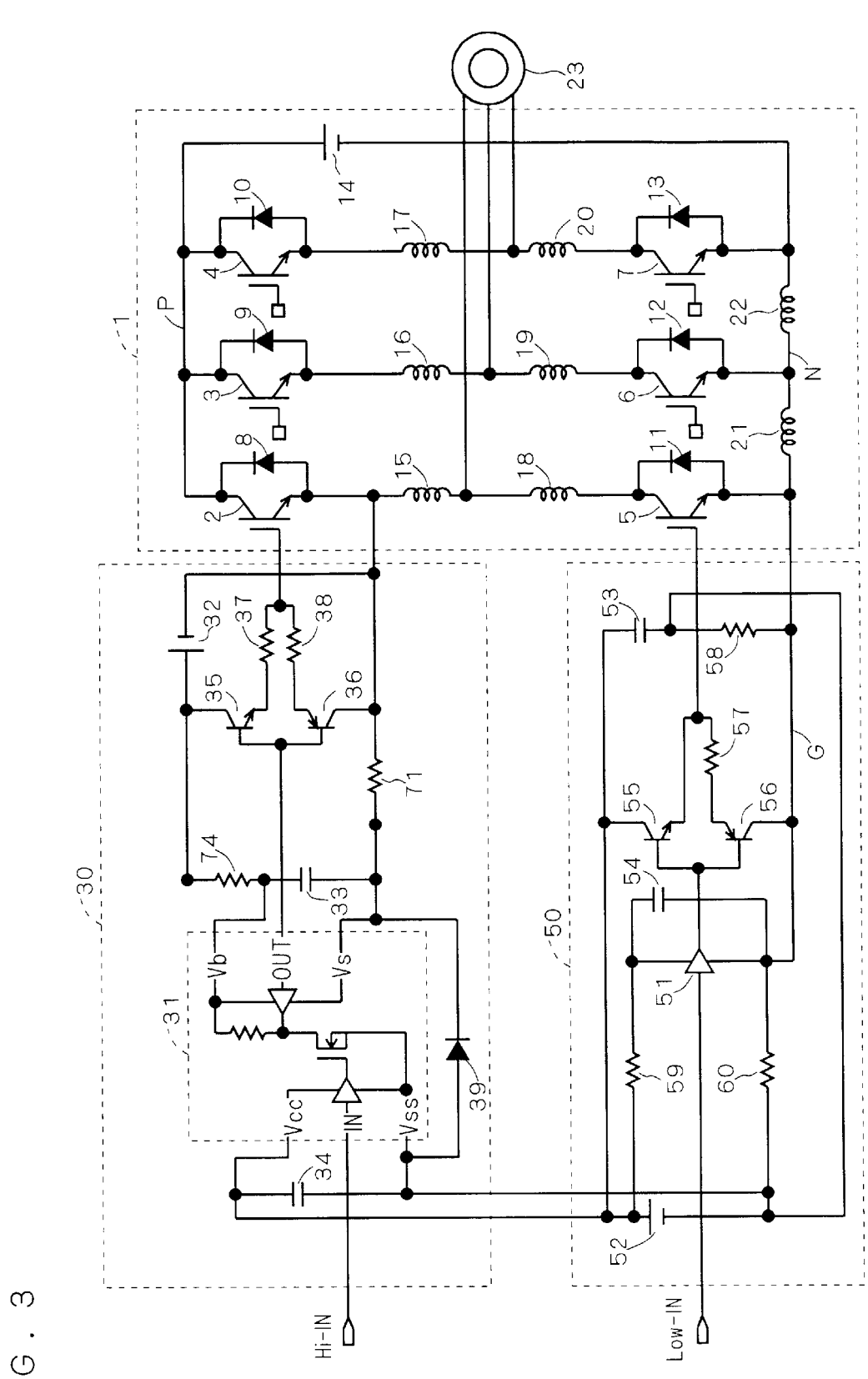
FIGS. 3 and 4 are circuit diagrams each illustrating a three-phase inverter circuit and a driver circuit thereof according to a modification of the second preferred embodiment of the present invention.

FIG. 3 is a circuit diagram illustrating the three-phase inverter circuit and the driver circuit thereof according to the modification of the second preferred embodiment. In the circuit shown in FIG. 3, the capacitor 72 in FIG. 2 is not provided. The positive pole of the power source 32 is connected to the high-voltage side power source terminal Vb in the high voltage IC 31 through the resistor 74, and the negative pole thereof is connected to the emitter terminal of the high side switching element 2.

Similar to the configuration of the second preferred embodiment, it is still allowed in the configuration according to the modification shown in FIG. 3 to limit the negative surge current flowing into the clamping diode 39, whereby the high voltage IC 31 of the high side switching driver circuit can be protected from the negative surge generated by the self inductance of the interconnect line. According to this modification, further, the number of constituent elements is reduced so that cost reduction is realized. The modification shown in FIG. 3 is applicable to the third or fifth preferred embodiment to be described later.

Figure 4:
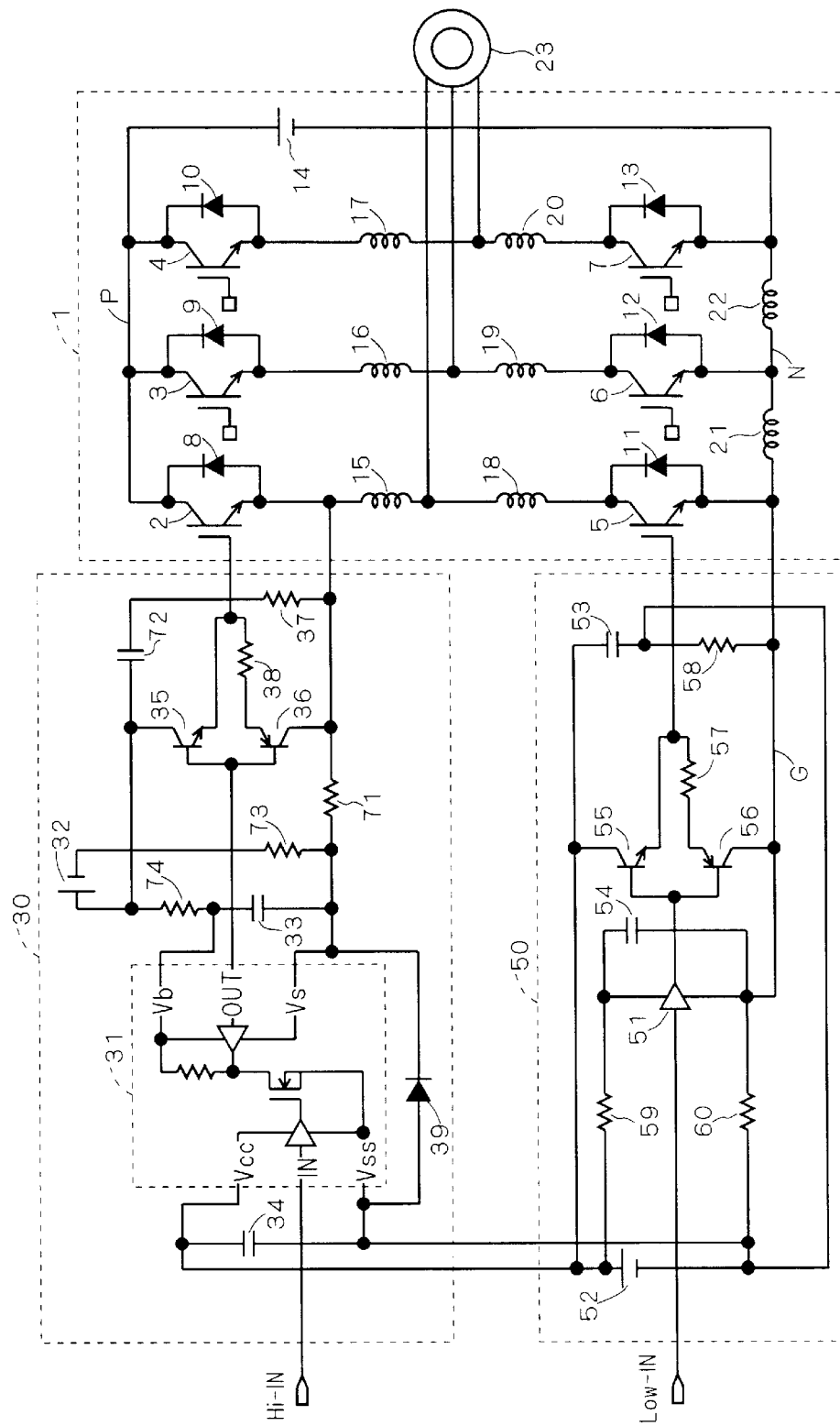

FIG. 4 is a circuit diagram illustrating the three-phase inverter circuit and the driver circuit thereof according to another modification of the second preferred embodiment. As shown in FIG. 4, the on-side gate resistor 37 (fourth current limiting element) provided to the emitter terminal of the NPN transistor 35 is moved to the position between the negative pole of the capacitor 72 (third capacitor) and the emitter terminal of the high side switching element 2.

Similar to the configuration of the second preferred embodiment, it is still allowed in the configuration according to the modification shown in FIG. 4 to limit the negative surge current flowing into the clamping diode 39, whereby the high voltage IC 31 of the high side switching driver circuit can be protected from the negative surge generated by the negative surge of the interconnect line. According to this modification, further, the surge current to flow into the capacitor 72 can be limited without affecting the switching characteristic of the high side switching element 2. The modification shown in FIG. 4 is applicable to the third, fourth, and fifth preferred embodiments to be described later.

Figure 5:
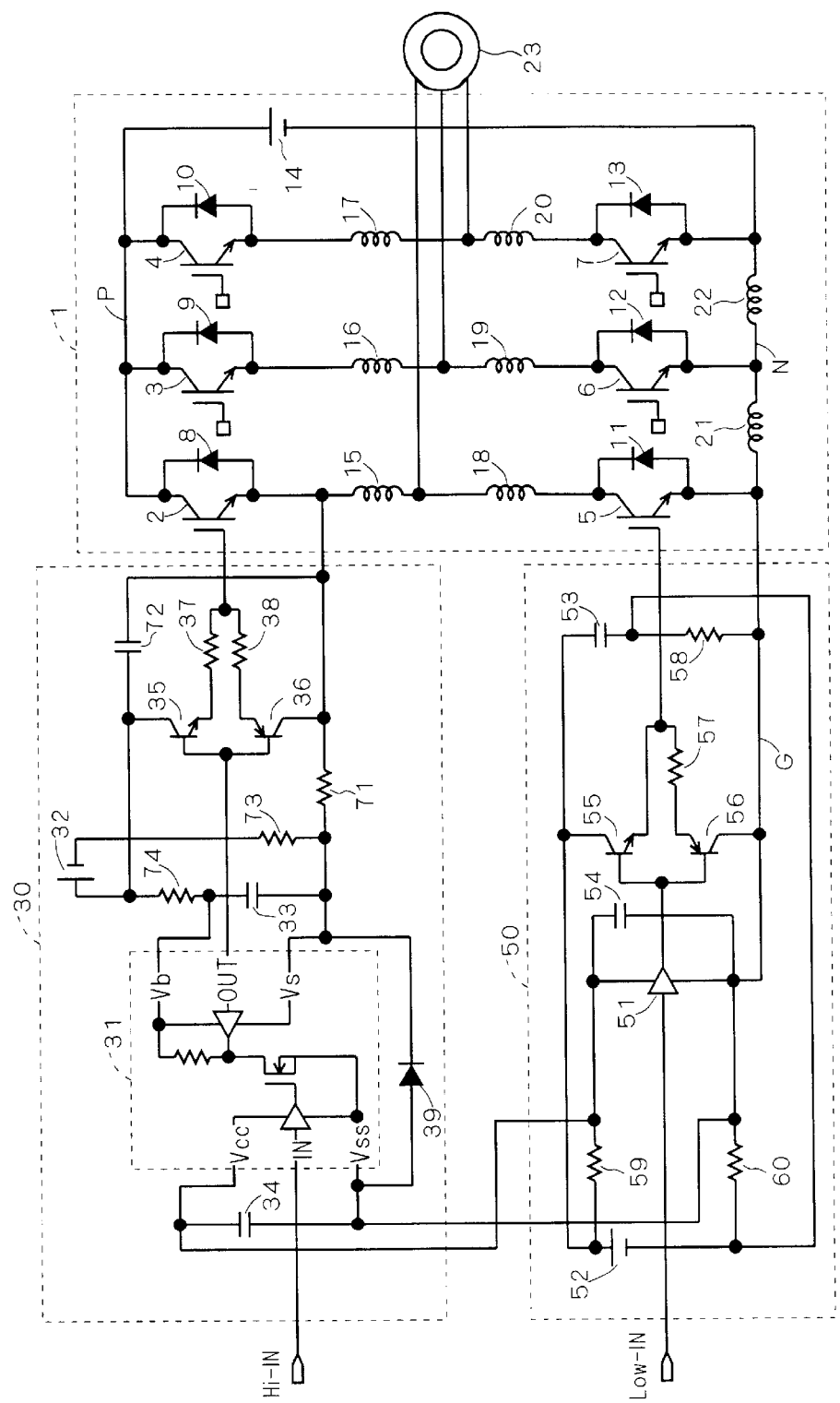
FIG. 5 is a circuit diagram illustrating a three-phase inverter circuit and a driver circuit thereof according to a third preferred embodiment of the present invention.

Third Preferred Embodiment FIG. 5 is a circuit diagram illustrating the three-phase inverter circuit and the driver circuit thereof according to the third preferred embodiment of the present invention. The configuration of the three-phase inverter circuit and the driver circuit thereof according to the third preferred embodiment is substantially the same as that of the second preferred embodiment. In the following, only the distinct configuration from that of the second preferred embodiment will be discussed, and the common configuration will be omitted.

In FIG. 5, the low-voltage side power source terminal Vcc in the high voltage IC 31 is connected to the positive pole of the capacitor 54 without passing through the resistor 59, and the low-voltage side reference terminal Vss is connected to the negative pole of the capacitor 54 without passing through the resistor 60. Namely, in the third preferred embodiment, the low-voltage side reference terminal Vss is directly connected to the second low potential power source line G of the low side switching driver circuit.

According to such configuration, on the occurrence of the negative surge, the negative surge current flows into the clamping diode 39 without passing through the resistor 58 in some cases. More particularly, the negative surge current may pass through the second low potential power source line G of the low side switching driver circuit, flowing into the low-voltage side reference terminal Vss in the high voltage IC 31. Even when the current to flow into the clamping diode 39 bypasses the resistor 58, it can be limited by the resistors 71, 73 and 74 provided on the side of the cathode of the clamping diode 39.

According to the driver circuit for power device of the third preferred embodiment, the high voltage IC 31 of the high side switching driver circuit can be protected from the negative surge generated by the self inductance of the interconnect line. Further, as the third preferred embodiment requires no high voltage IC in the low side switching driver circuit, scaledown and cost reduction of the driver circuit are realized.

The third preferred embodiment is advantageous in that as the low-voltage side reference terminal Vss in the high voltage IC 31 and the negative pole of the capacitor 54 are directly connected, the low-voltage side reference terminal Vss in the high voltage IC 31 and the second low potential power source line G of the low side switching driver circuit 50 can be the same in potential. Therefore, the high side switching driver circuit 30 including the high voltage IC 31 and the low side switching driver circuit 50 can be integrated on the same chip. As a result, scaledown of the driver circuit for power device is promoted to a greater degree.

Considering power loss and switching characteristic of the low side switching element, the third preferred embodiment does not include the resistor 307 as provided in FIG. 8, but includes the resistor 58 between the negative pole of the capacitor 53 and the second low potential power source line G of the low side switching driver circuit. However, the present invention is not limited to this configuration. The resistor 307 shown in FIG. 8 may be provided, and the resistor 58 may be at any position on the interconnect line directly connecting the negative pole of the capacitor 53 and the negative pole of the power source 52. Instead of the emitter follower circuit of the third preferred embodiment, further, a source follower circuit formed by an MOSFET, or a grounded emitter of a bipolar circuit may be applicable to the present invention.

Fourth Preferred Embodiment

Figure 6:
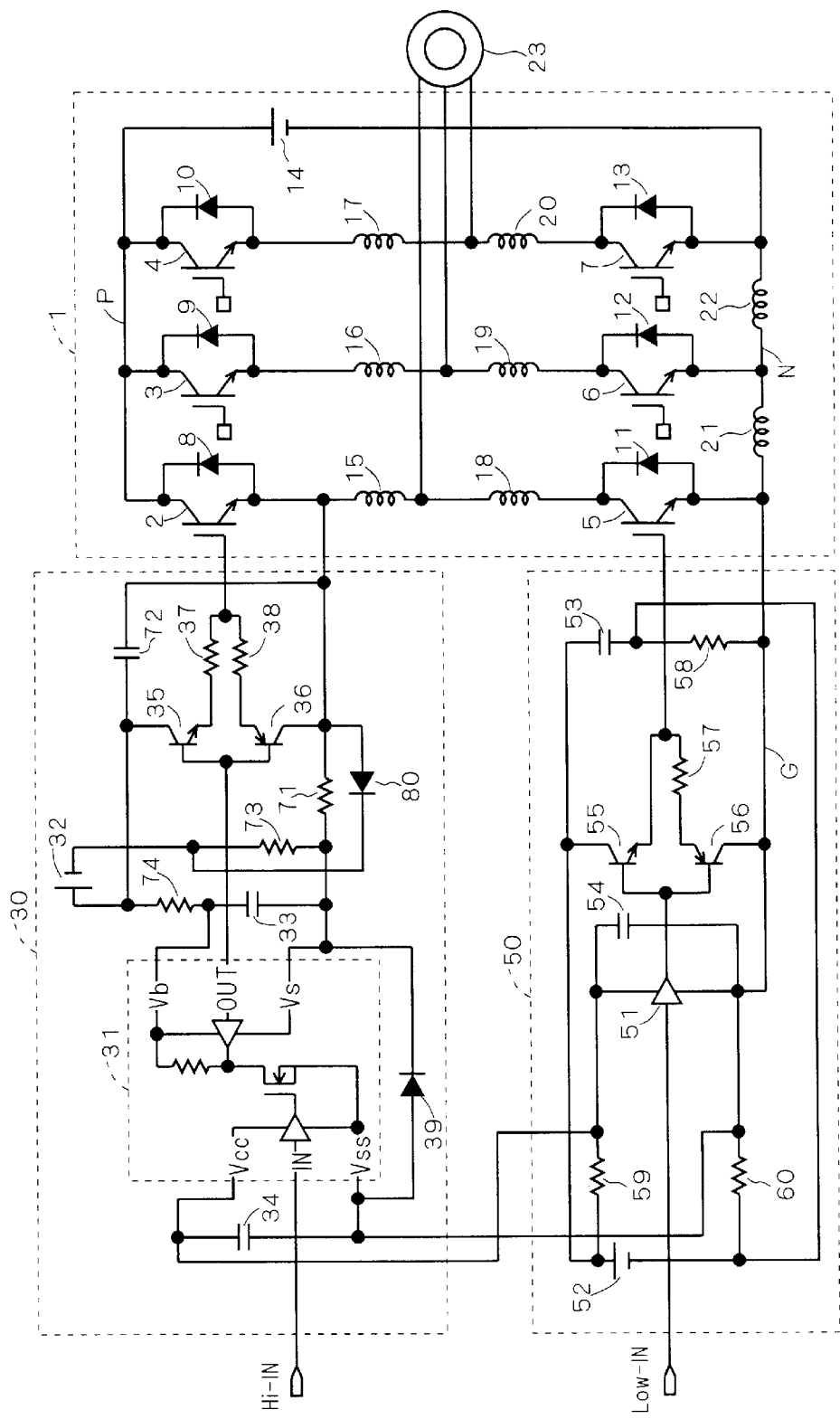
FIG. 6 is a circuit diagram illustrating a three-phase inverter circuit and a driver circuit thereof according to a fourth preferred embodiment of the present invention.

FIG. 6 is a circuit diagram illustrating the three-phase inverter circuit and the driver circuit thereof according to the fourth preferred embodiment of the present invention. The configuration of the three-phase inverter circuit and the driver circuit thereof according to the fourth preferred embodiment is substantially the same as that of the third preferred embodiment. In the following, only the distinct configuration from that of the third preferred embodiment will be discussed, and the common configuration will be omitted.

As shown in FIG. 6, a by-pass diode 80 is further provided. The cathode of the by-pass diode 80 is connected to the negative pole of the power source 32, and the anode thereof is connected to the collector terminal of the PNP transistor 36. Bypassing the resistors 71 and 73, the by-pass diode 80 connects the negative pole of the power source 32 and the collector terminal of the PNP transistor 36.

When the high side switching element 2 is to be driven, the capacitor 72 of the high side switching driver circuit 30 should be charged. For charging the capacitor 72, current starts to flow from the positive pole of the power source 32, passing through the capacitors 72 and the resistors 71, 73, and then returns to the negative pole of the power source 32. Following this path, power loss is caused by the resistors 71 and 73 in the driver device for power device of the third preferred embodiment. The power loss thus caused is approximately the same in level as the gate driving power of the high side switching element 2, resulting in loss of significant amount of power as Joule heat.

According to the fourth preferred embodiment, the foregoing path is allowed to bypass the resistors 71 and 73 by the existence of the by-pass diode 80. As a result, when the capacitor 72 of the high side switching driver circuit 30 is charged, no power loss by the resistors 71 and 73 is caused.

According to the fourth preferred embodiment, the resistors 58, 71, 73 and 74 as current limiting elements are also operative to limit the negative surge current to flow into the clamping diode 39. According to the driver circuit for power device of the fourth preferred embodiment, the high voltage IC 31 of the high side switching driver circuit is thus protected from the negative surge generated by the self inductance of the interconnect line. Further, as the fourth preferred embodiment requires no high voltage IC in the low side switching driver circuit, scaledown and cost reduction of the driver circuit are realized.

Considering power loss and switching characteristic of the low side switching element, the fourth preferred embodiment does not include the resistor 307 as provided in FIG. 8, but includes the resistor 58 between the negative pole of the capacitor 53 and the second low potential power source line G of the low side switching driver circuit. However, the present invention is not limited to this configuration. The resistor 307 shown in FIG. 8 may be provided, and the resistor 58 may be at any position on the interconnect line directly connecting the negative pole of the capacitor 53 and the negative pole of the power source 52. Instead of the emitter follower circuit of the fourth preferred embodiment, further, a source follower circuit formed by an MOSFET, or a grounded emitter of a bipolar circuit may be applicable to the present invention.

Fifth Preferred Embodiment

Figure 7:
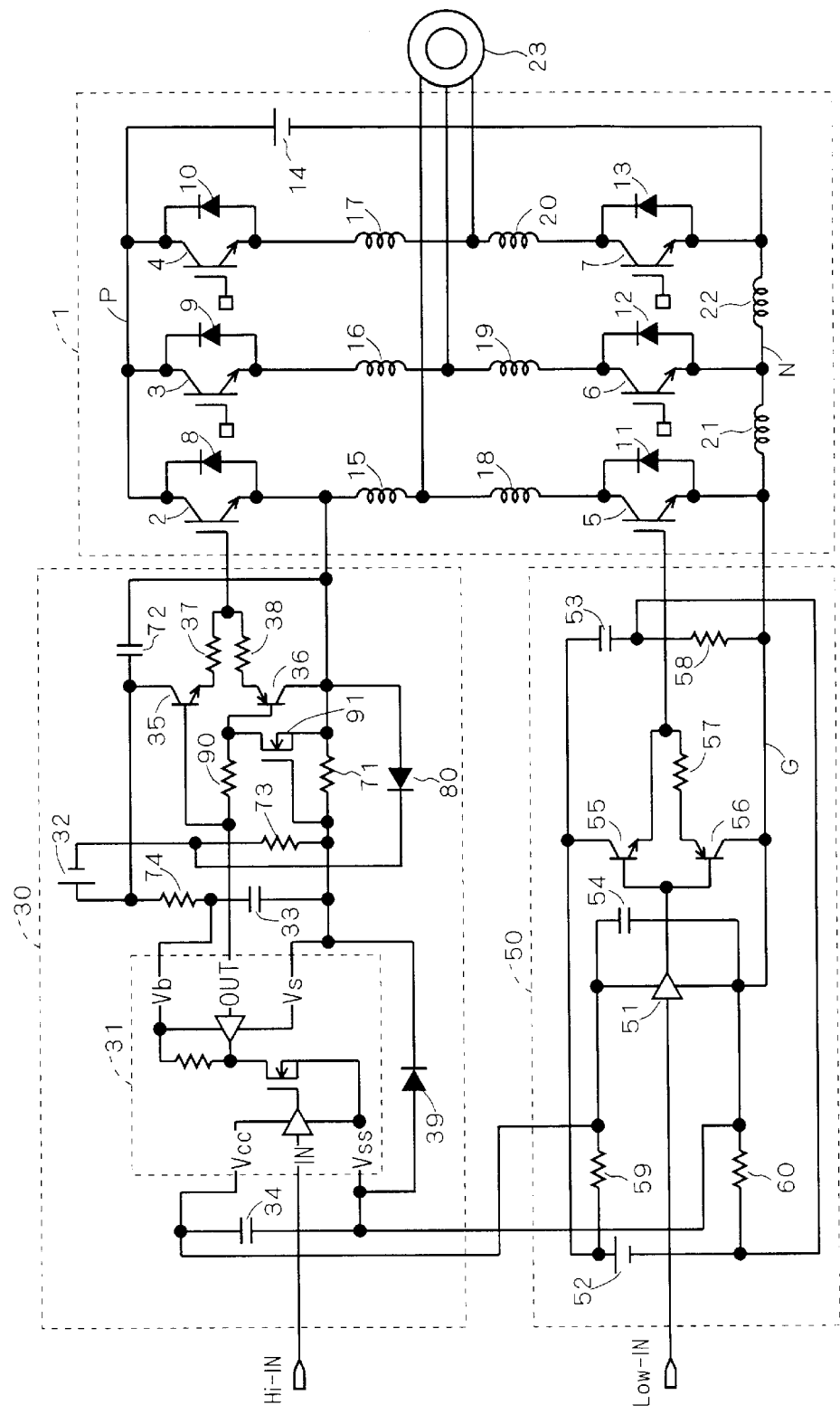
FIG. 7 is a circuit diagram illustrating a three-phase inverter circuit and a driver circuit thereof according to a fifth preferred embodiment of the present invention.

FIG. 7 is a circuit diagram illustrating the three-phase inverter circuit and the driver circuit thereof according to the fifth preferred embodiment of the present invention. The configuration of the three-phase inverter circuit and the driver circuit thereof according to the fifth preferred embodiment is substantially the same as that of the fourth preferred embodiment. In the following, only the distinct configuration from that of the fourth preferred embodiment will be discussed, and the common configuration will be omitted.

As shown in FIG. 7, a resistor 90 as a current limiting element (fifth current limiting element) is further provided between the base terminal of the PNP transistor 36 and the output terminal OUT in the high voltage IC 31. Further provided is a transistor 91 having a base terminal connected to the high-voltage side reference terminal Vs, a collector terminal connected to the base terminal of the PNP transistor 36, and an emitter terminal connected to the collector terminal of the PNP transistor 36. In FIG. 7, the transistor 91 is shown to be an MOSFET. Alternatively, it may be a bipolar transistor.

Next, the operations of the resistor 90 and the transistor 91 will be discussed. When there is no input signal to the high voltage IC 31, the output voltage to the emitter follower circuit is 0 V. As the emitter follower circuit is formed by the NPN transistor 35 and the PNP transistor 36, and the input signal thereto relative to the collector of the PNP transistor 36 is 0V, the output voltage of the emitter follower circuit is also 0V. As a result, the high side switching element 2 is turned off.

However, when the negative surge current generated at the inverter circuit 1 flows into the clamping diode 39, the resistor 71 also receives a part of the negative surge current flowing thereinto. As a result, voltage drop occurs in the resistor 71, causing reduction in collector voltage of the PNP transistor 36. The input signal to the emitter follower circuit is corresponding to the sum of the output voltage of the high voltage IC 31 and the collector voltage of the PNP transistor 36, and therefore, the voltage corresponding to the amount of voltage drop in the resistor 71 is outputted from the emitter follower circuit. The rise in output voltage of the emitter follower circuit causes malfinction in the high side switching element 2. For example, turn-off period of the high side switching element 2 may be extended, or the switching element 2 may be switched form OFF state to ON state. Such malfunction in the high side switching element 2 results in increase in switching loss.

The resistor 90 and the transistor 91 are provided in the fifth preferred embodiment. Therefore, when the voltage drop occurs in the resistor 71, the transistor 91 is switched to ON state, thereby switching the PNP transistor 36 to ON state. As the NPN transistor 35 is switched to ON state by the voltage drop in the resistor 71, the voltage of the emitter follower circuit is determined by the difference in emitter voltage between the NPN transistor 35 and the PNP transistor 36, which is lower than the voltage drop in the resistor 71. At this time, the emitter voltage of the PNP transistor 36 is corresponding to the sum of the collector voltage of the transistor 91 and the base-emitter voltage of the PNP transistor 36. Further, the emitter voltage of the NPN transistor 35 is corresponding to the sum of the output voltage of the high voltage IC 31, the collector voltage of the PNP transistor 36, and the base-emitter voltage of the NPN transistor 35.

The base terminals of the NPN transistor 35 and the PNP transistor 36 are separated by the resistor 90, and therefore, ON state of the transistor 91 has no effect on the NPN transistor 35. The resistor 90 is operative to prevent a large current from flowing into the output terminal OUT and the high-voltage side reference terminal Vs in the high voltage IC 31.

As described, by providing the resistor 90 and the transistor 91, it is allowed to reduce the output voltage of the emitter follower circuit when the PNP transistor 36 is in ON state. As a result, the output voltage of the emitter follower circuit can be lower than the gate threshold voltage of the high side switching element 2, whereby malfunction in the high side switching element 2 such as extended turn-off period or switching from OFF state to ON state can be prevented. By determining the resistance values of the resistors 37 and 38, the output voltage of the emitter follower circuit can be effectively lower than the gate threshold voltage of the high side switching element 2.

According to the fifth preferred embodiment, the resistors 58, 71, 73 and 74 as current limiting elements are also operative to limit the negative surge current to flow into the clamping diode 39. According to the driver circuit for power device of the fifth preferred embodiment, the high voltage IC 31 of the high side switching driver circuit is thus protected from the negative surge generated by the self inductance of the interconnect line. Further, as the fifth preferred embodiment requires no high voltage IC in the low side switching driver circuit, scaledown and cost reduction of the driver circuit are realized.

Considering power loss and switching characteristic of the low side switching element, the fifth preferred embodiment does not include the resistor 307 as provided in FIG. 8, but includes the resistor 58 between the negative pole of the capacitor 53 and the second low potential power source line G of the low side switching driver circuit. However, the present invention is not limited to this configuration. The resistor 307 shown in FIG. 8 may be provided, and the resistor 58 may be at any position on the interconnect line directly connecting the negative pole of the capacitor 53 and the negative pole of the power source 52.

While the invention has been shown and described in detail, the foregoing description is in all aspects illustrative and not restrictive. It is therefore understood that numerous modifications and variations can be devised without departing from the scope of the invention.

What is claimed is:

1. A driver circuit for power device, comprising:
   a plurality of low side switching elements for constituting an inverter circuit, said plurality of low side switching elements each having one terminal connected to a load, and other terminal connected to a low potential line of said inverter circuit;
   a plurality of high side switching elements for constituting said inverter circuit, said plurality of high side switching elements each having one terminal connected to said load, and other terminal connected to a high potential line of said inverter circuit;
   a plurality of high side switching driver circuits for respectively driving said plurality of high side switching elements, said plurality of high side switching driver circuits each including a high voltage IC; and
   a plurality of low side switching driver circuits for respectively driving said plurality of low side switching elements, said plurality of low side switching driver circuits each comprising a first low potential power source line, a second low potential power source line, a first high potential power source line, and a second high potential power source line each connected to said high voltage IC, wherein
   said plurality of low side switching driver circuits each comprise:
      a first power source to which said plurality of low side switching driver circuits are commonly connected;
      a first capacitor connected to said first power source through said first low potential power source line and said first high potential power source line;
      a second capacitor connected to said first power source through said second low potential power source line and said second high potential power source line;
      a first current limiting element provided between a node between said first low potential power source line and said first capacitor, and said second low potential power source line; and
      second current limiting elements respectively provided on said second low potential power source line and said second high potential power source line for connecting said first power source and said second capacitor.

2. The driver circuit for power device according to claim 1, wherein
   said first current limiting element acts as an on-side gate resistor of each of said plurality of low side switching elements.

3. The driver circuit for power device according to claim 2, wherein
   said plurality of high side switching driver circuits each comprise third current limiting elements provided on interconnect lines for connecting said high voltage IC and said plurality of high side switching elements, said plurality of third current limiting elements being operative to limit surge current generated at said inverter circuit.

4. The driver circuit for power device according to claim 3, wherein
   said plurality of third current limiting elements are provided on interconnect lines,
   one of said interconnect lines is defined between a high-voltage side reference terminal in said high voltage IC and said one terminal of each of said plurality of high side switching elements,
   another one of said interconnect lines is defined between a negative pole of a second power source for driving said each of said high side switching driver circuits and said high-voltage side reference terminal, and
   another one of said interconnect lines is defined between a high-voltage side power source terminal in said high voltage IC and a positive pole of said second power source.

5. The driver circuit according to claim 4, wherein
   said plurality of high side switching driver circuits each comprise:
      a third capacitor provided between said positive pole of said second power source and said one terminal of each of said plurality of high side switching elements; and
      a fourth current limiting element provided between said third capacitor and said one terminal of each of said plurality of high side switching elements, said fourth current limiting element acting as an on-side gate resistor of each of said plurality of high side switching elements.

6. The driver circuit according to claim 4, wherein
   said plurality of high side switching driver circuits each further comprise a by-pass diode having an anode connected to said one terminal of each of said plurality of high side switching elements, and a cathode connected to said negative pole of said second power source.

7. The driver circuit according to claim 6, wherein said high voltage IC has a low-voltage side reference terminal and a low-voltage side power source terminal which are respectively connected to said second low potential power source line and said second high potential power source line of each of said low side switching driver circuits without passing through said second current limiting elements.

8. The driver circuit according to claim 7, wherein said plurality of high side switching driver circuits each further comprise:

a fifth current limiting element provided between a base terminal of a PNP transistor and an output terminal in said high voltage IC, said PNP transistor constituting an emitter follower circuit of each of said plurality of high side switching driver circuits; and a transistor having a base terminal connected to said high-voltage side reference terminal in said high voltage IC, a collector terminal connected to said base terminal of said PNP transistor, and an emitter terminal connected to a collector terminal of said PNP transistor.

* * * * *